(12) United States Patent
Benner et al.

(10) Patent No.: US 11,242,960 B2
(45) Date of Patent: Feb. 8, 2022

(54) COMPOSITE MATERIAL FOR LIGHTING FILTERING, LIGHTING APPARATUS, AND METHOD FOR DETERMINING DOPING CONCENTRATION OR THICKNESS OF COMPOSITE MATERIAL

(71) Applicant: SAVANT TECHNOLOGIES LLC, Norwalk, CT (US)

(72) Inventors: Kevin Benner, East Cleveland, OH (US); Qing Yi, Shanghai (CN); Zhiyong Wang, Shanghai (CN); Jianmin He, East Cleveland, OH (US); Huisheng Zhou, Shanghai (CN); Jian Li, Shanghai (CN); Dengke Cai, Mentor, OH (US); Tomas Clynne, East Cleveleand, OH (US); Thomas Boyle, East Cleveland, OH (US)

(73) Assignee: SAVANT TECHNOLOGIES LLC, Norwalk, CT (US)

( * ) Notice: Subject to any disclaimer, the term of this patent is extended or adjusted under 35 U.S.C. 154(b) by 0 days.

(21) Appl. No.: 17/086,263

(22) Filed: Oct. 30, 2020

(65) Prior Publication Data

US 2021/0048153 A1    Feb. 18, 2021

Related U.S. Application Data

(62) Division of application No. 16/061,479, filed as application No. PCT/US2016/069236 on Dec. 29, 2016, now Pat. No. 10,830,398.

(30) Foreign Application Priority Data

Dec. 29, 2015    (CN) .......................... 201511015919.9

(51) Int. Cl.
*F21K 9/64*    (2016.01)
*G02B 5/20*    (2006.01)
(Continued)

(52) U.S. Cl.
CPC ................ *F21K 9/64* (2016.08); *F21K 9/232* (2016.08); *F21K 9/66* (2016.08); *F21V 3/0625* (2018.02);
(Continued)

(58) Field of Classification Search
CPC ......... F21K 9/64; H01L 33/501; F21V 3/0625
See application file for complete search history.

(56) References Cited

U.S. PATENT DOCUMENTS 8,324,808 B2    12/2012    Maxik
9,024,536 B2    5/2015    Maxik
(Continued)

FOREIGN PATENT DOCUMENTS

AU    2014408631 A1 *    4/2017    ................ F21V 3/12
CN    104650568 A    5/2015
(Continued)

OTHER PUBLICATIONS

Invitation to Pay Additional Fees issued in connection with corresponding PCT Application No. PCT/US2016/069236 dated Mar. 23, 2017.
(Continued)

*Primary Examiner* — Evan P Dzierzynski
(74) *Attorney, Agent, or Firm* — Wood IP LLLC

(57) ABSTRACT

A composite material for light filtering, comprising: a polymeric matrix material and particles of neodymium compound doped in the polymeric matrix material. A lighting apparatus comprises the composite material, a method for determining a doping concentration of particles of neodymium compound in the composite material, and a method for determining a thickness of the composite material are also described.

20 Claims, 6 Drawing Sheets

(51) Int. Cl.
   *H01L 33/56*    (2010.01)
   *H01L 33/50*    (2010.01)
   *F21K 9/66*     (2016.01)
   *F21K 9/232*    (2016.01)
   *F21V 3/06*     (2018.01)
   *F21V 9/08*     (2018.01)
   *G01B 11/06*    (2006.01)
   *G01N 21/25*    (2006.01)
   *F21Y 115/10*   (2016.01)

(52) U.S. Cl.
   CPC ............. *F21V 9/08* (2013.01); *G01B 11/06* (2013.01); *G01N 21/251* (2013.01); *G02B 5/206* (2013.01); *H01L 33/501* (2013.01); *H01L 33/502* (2013.01); *H01L 33/56* (2013.01); *F21Y 2115/10* (2016.08)

(56) References Cited

U.S. PATENT DOCUMENTS

| | | |
|---|---|---|
| 10,121,941 B2 | 11/2018 | Iwakura |
| 10,830,398 B2 | 11/2020 | Benner |
| 2005/0127833 A1 | 6/2005 | Tieszen |
| 2014/0191653 A1 | 7/2014 | Edmond et al. |
| 2014/0268794 A1 | 9/2014 | Donofrio et al. |
| 2015/0325741 A1 | 11/2015 | Komada |
| 2016/0356435 A1* | 12/2016 | Dudik .............. F21V 9/08 |
| 2017/0073547 A1 | 3/2017 | Ogawa |
| 2017/0288097 A1 | 10/2017 | Li et al. |

FOREIGN PATENT DOCUMENTS

| | | |
|---|---|---|
| JP | 2004-193581 A | 7/2004 |
| JP | 2015-214681 A | 12/2015 |
| JP | 2017069392 A | 4/2017 |
| WO | 2015/025631 | 2/2015 |
| WO | 2015/035425 A1 | 3/2015 |
| WO | 2016/057604 A1 | 4/2016 |

OTHER PUBLICATIONS

International Search Report and Written Opinion issued in connection with corresponding PCT Application No. PCT/US2016/069236 dated Jun. 8, 2017.

Machine translation and First Office Action and Search issued in connection with corresponding CN Application No. 201511015919.9 dated Jun. 5, 2018.

International Preliminary Report on Patentability issued in connection with corresponding PCT Application No. PCT/US2016/069236 dated Jul. 3, 2018.

Japan Office Action for Japanese Patent Application No. 2018-533692, dated Jan. 4, 2021, 10 pages.

* cited by examiner

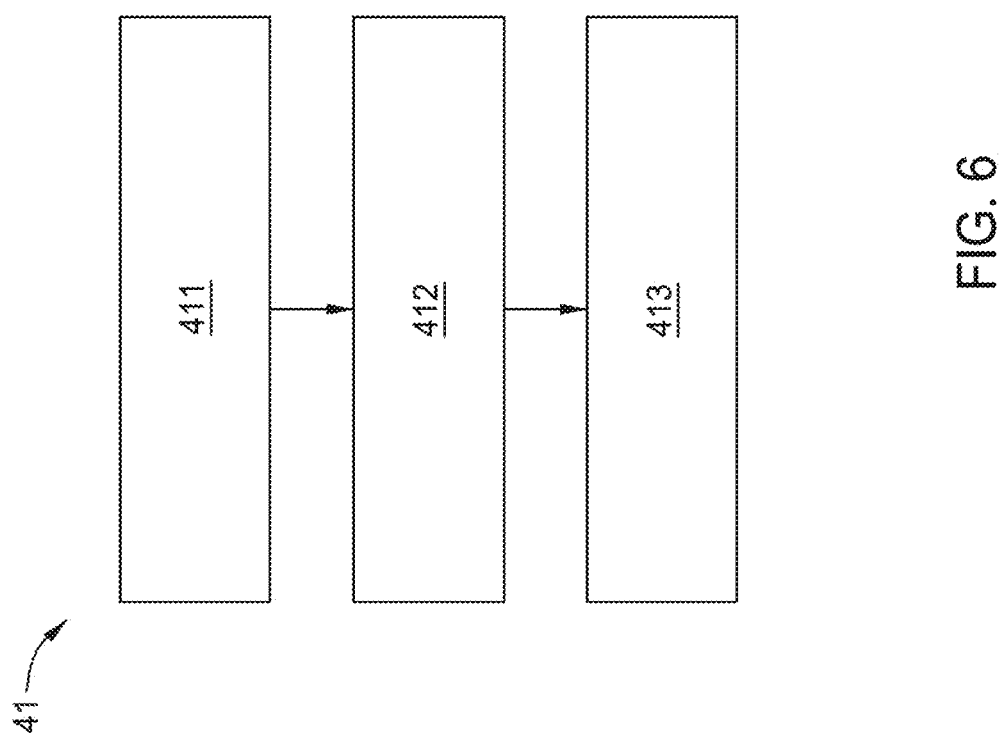

COMPOSITE MATERIAL FOR LIGHTING FILTERING, LIGHTING APPARATUS, AND METHOD FOR DETERMINING DOPING CONCENTRATION OR THICKNESS OF COMPOSITE MATERIAL

BACKGROUND OF THE DISCLOSURE

This invention relates generally to lighting systems and related technologies. More particularly, this invention relates to a composite material for lighting filtering, a lighting apparatus using the composite material, and a method for determining a doping concentration of particles of neodymium compound in the composite material or a thickness of the composite material.

LED lamps provide a variety of advantages over more traditional incandescent and fluorescent lamps, including but not limited to a longer life expectancy, high energy efficiency, and full brightness without requiring time to warm up. As known in the art, LEDs (which as used herein also encompass organic LEDs, or OLEDs) are solid-state semiconductor devices that convert electrical energy into electromagnetic radiation that includes visible light with wavelengths of about 400 to 750 nm. The LED typically comprises a chip (die) of a semiconducting material doped with impurities to create a p-n junction. The LED chip is electrically connected to an anode and a cathode, both of which are often mounted within a package. Because, in comparison to other lamps such as incandescent or fluorescent lamps, the LEDs may emit visible light that is more directional in a narrower beam, the LEDs have traditionally been utilized in applications such as automotive, display, safety/emergency, and directed area lighting. However, advances in LED technology have enabled highly-efficient LED-based lighting systems to find wider use in lighting applications that have traditionally employed other types of lighting sources, for example, including omnidirectional lighting applications previously served by incandescent and fluorescent lamps. As a result, the LEDs are increasingly being used for area lighting applications such as in residential, commercial and municipal settings.

An LED based light source, often an LED array, comprises multiple LED devices. Because the LED devices emit visible light in narrow bands of wavelengths, for example, green, blue, red, etc., combinations of different LED devices are often combined in LED lamps to produce various light colors, including white light. Alternatively, light that appears substantially white may be generated by a combination of light from a blue LED and a phosphor (e.g., YAG:Ce) that converts at least some of the blue light of the blue LED to a different color; the combination of the converted light and the blue light can generate light that appears white or substantially white.

However, in the case of a light that appears substantially white is generated by a combination of light from a blue LED and a phosphor, the whiteness and color saturation index (CSI) of the light is still not so ideal.

BRIEF DESCRIPTION OF THE DISCLOSURE

A composite material for light filtering is provided. The composite material comprises a polymeric matrix material and particles of neodymium compound doped in the polymeric matrix material, wherein a weight percentage of the particles of neodymium compound in the composite material is from 0.4% to 8%.

A lighting apparatus is provided. The lighting apparatus comprises a white LED package; and an optical component comprising the composite material afore-described; wherein at least part of the yellow light generated by the white LED package is filtered by the optical component.

Another lighting apparatus is provided. The lighting apparatus comprises a white LED package comprising a blue light source with a peak wavelength less than 435 nm and a phosphor; and an optical component, wherein at least part of the yellow light generated by the white LED package is filtered by the optical component.

A method for determining a doping concentration of particles of neodymium compound in a composite material is provided. The method comprises pre-determining a first mapping relationship of a colorimetric property of visible light passing through the composite material and the doping concentration of particles of neodymium compound in the composite material; and determining the doping concentration of particles of neodymium compound in the composite material corresponding to a desired colorimetric property based on the first mapping relationship.

A method for determining a thickness of a composite material is provided. The method comprises pre-determining a second mapping relationship of a colorimetric property of visible light passing through the composite material and the thickness of the composite material; and determining the thickness of the composite material corresponding to a desired colorimetric property based on the second mapping relationship.

BRIEF DESCRIPTION OF THE DRAWINGS

The above and other aspects, features, and advantages of the present disclosure will become more apparent in light of the following detailed description when taken in conjunction with the accompanying drawings in which:

FIG. 6 illustrates a schematic flow diagram of a step 41 of FIG. 5 in accordance with an embodiment of the present invention.

DETAILED DESCRIPTION OF THE INVENTION

Figure 1:
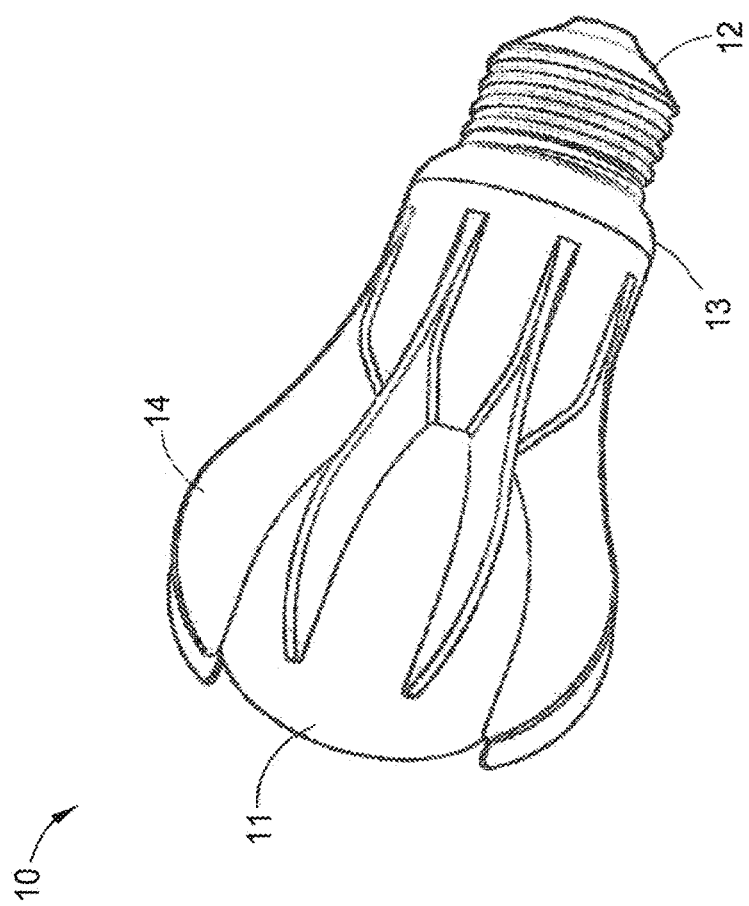
FIG. 1 illustrates a lighting apparatus comprising an optical component in accordance with an embodiment of the present invention.

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of the present disclosure.

Unless defined otherwise, technical and scientific terms used herein have the same meaning as is commonly understood by one of ordinary skill in the art to which the present disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having," and variations thereof herein are meant to encompass the items listed thereafter and equivalents thereof as well as additional items.

The present invention provides a composite material suitable for use in a lighting apparatus to impart a color filtering effect, especially a yellow light filtering effect, to visible light. The composite material comprises a polymeric matrix material and particles of neodymium compound doped in the polymeric matrix material.

In some embodiments, the polymeric matrix material comprises but is not limited to: polycarbonate, polystyrene, polyacrylate, silicone, or any combination thereof.

In some embodiments, the particles of neodymium compound doped in the polymeric matrix material comprise $Nd^{3+}$ ions. One source for the $Nd^{3+}$ ions may be materials comprising an Nd—F compound. As used herein, the "Nd—F compound" should be broadly construed to include compounds comprising neodymium and fluoride and optionally other elements. Such compounds comprising neodymium and fluoride may comprise neodymium fluoride, or neodymium oxyfluoride (e.g., $NdO_xF_y$ where 2x+y=3), or neodymium fluoride comprising adventitous water and/or oxygen, or a neodymium hydroxide fluoride (e.g., $Nd(OH)_aF_b$ where a+b=3), or numerous other compounds comprising neodymium and fluoride. In some applications, the Nd—F compound may have a relatively low refractive index, such as a refractive index that matches selected polymeric matrix materials to provide a low-haze composite material. One useful $Nd^{3+}$ ion source may be neodymium fluoride ($NdF_3$), which has a refractive index of around 1.6 and provides a suitably low refractive index for matching with certain polymeric matrix materials to minimize scattering losses. Other $Nd^{3+}$ ion sources are possible, for example, other compounds containing Nd—F, nonlimiting examples of which include Nd—X—F compounds where X is at least one element that forms a compound with neodymium, as examples, oxygen, nitrogen, sulfur, chlorine, etc., or at least one metallic element (other than Nd) that forms a compound with fluorine, as examples, metallic elements such as Na, K, Al, Mg, Li, Ca, Sr, Ba, and Y, or combinations of such elements. Particular examples of Nd—X—F compounds may include: neodymium oxyfluoride (Nd—O—F) compounds; Nd—X—F compounds in which X may be Mg and Ca or may be Mg, Ca and O; as well as other compounds containing Nd—F.

A weight percentage of the particles of neodymium compound in the composite material is from 0.4% to 8%. In some embodiments, the weight percentage of the particles of neodymium compound in the composite material is from 2% to 8%. In some embodiments, the weight percentage of the particles of neodymium compound in the composite material is from 4% to 6%.

The following table 1 shows a chromaticity coordinate (CCX and CCY), CRI (Color Rendering Index), R9 (CRI of red light) and CSI (Color Saturation Index) of lights generated by a LED package passing through composite materials with different doping concentrations (weight percentages) of the particles of neodymium compound, wherein the thickness of each composite material is 1 mm, the polymeric matrix material of each composite materials is formed of silicone and the neodymium compound is $NdF_3$, and the CRI of the LED package is about 80. In addition, no data is recorded of CSI when the doping concentration of $NdF_3$ particles is 0%.

TABLE 1

| doping concentration of $NdF_3$ particles (weight percentage) | CCX | CCY | CRI | R9 | CSI |
| --- | --- | --- | --- | --- | --- |
| 0% | 0.435022 | 0.405818 | 81.51884 | 15.2 | None |
| 4% | 0.437443 | 0.400248 | 85.34995 | 29.3 | −4 |
| 6% | 0.438682 | 0.397091 | 87.37472 | 36.8 | 3 |
| 8% | 0.439698 | 0.394287 | 88.83752 | 41.9 | 7 |

According to the table 1, it can be seen that CRI, R9 and CSI are better with the increase of the doping concentration of $NdF_3$ particles.

The following table 2 shows a chromaticity coordinate (CCX and CCY), CRI and R9 of lights generated by a LED package passing through composite materials with different doping concentrations (weight percentages) of the particles of neodymium compound, wherein the thickness of each composite material is increased from a middle to an edge of the composite material and the thickness of the middle is 1.5 mm and the thickness of the edge is 4.2 mm, the polymeric matrix material of each composite materials is PC and the neodymium compound is NdFO, and the CRI of the LED package is about 80.

TABLE 2

| doping concentration of $NdF_3$ particles (weight percentage) | CCX | CCY | CRI | R9 |
| --- | --- | --- | --- | --- |
| 0% | 0.4593 | 0.4088 | 81.08 | 4.49 |
| 0.4% | 0.4566 | 0.4040 | 87.54 | 32.48 |
| 0.75% | 0.4561 | 0.4019 | 90.56 | 46.97 |
| 1.25% | 0.4511 | 0.3973 | 95.37 | 80.97 |
| 1.5% | 0.4511 | 0.3932 | 94.44 | 93.24 |
| 2% | 0.4511 | 0.3895 | 90.71 | 87.90 |

According to the table 2, it can be seen that, compared with a material does not comprises $NdF_3$ particles, the composite material comprising $NdF_3$ particles may improve the light performance by passing the light through the composite material.

In some embodiments, the composite material may further comprise particles of additive doped in the polymeric matrix material for light diffusion. In some embodiments, the particles of additive doped in the polymeric matrix material comprise but are not limited to: rutile titania ($TiO_2$, refractive index of about 2.74), $Al_2O_3$, and Nd—O compounds (such as $Nd_2O_3$) or other neodymium-containing metal oxides (such as Nd-containing perovskite structure materials). With this approach, the particles of $NdF_3$ (or another $Nd^{3+}$ ion source) may be largely or solely responsible for the color filtering effect and the particles of additive may be largely or solely responsible for achieving a significant level of optical scattering.

In some embodiments, the difference of refractive indices of the polymeric matrix material and the particles of neodymium compound is less than 0.1 in the visible light region. Generally, a low-haze (low-diffusivity) optical effect, typically due to a minimal level of optical scattering, may be achieved herein if the difference of refractive indices of the polymeric matrix material and the particles of neodymium compound is less than 0.1 in the visible light region. If the particles of neodymium compound is formed of $NdF_3$ whose polymeric matrix material is a polycarbonate (PC) or polystyrene (PS), the refractive indices of $NdF_3$ (about 1.60) and PC or PS (about 1.586) are such that a minimal level of optical scattering occurs when light passes through the composite material. Another example of a polymer having a refractive index within 0.1 of $NdF_3$ is a fluorine-doped polyester (refractive index of about 1.607). In this regard, the polymeric matrix material is chosen on the basis of having a refractive index that is similar to the particles of neodymium compound so as to achieve a low-haze (low-diffusivity) optical effect.

In some embodiments, the difference of refractive indices of the polymeric matrix material and the particles of neodymium compound is more than 0.1 in the visible light region. For example, the polymeric matrix material is PC with a refractive indices of about 1.586 and the neodymium compound is NdFO with a refractive indices of about 1.7.

The present invention further provides a lighting apparatus comprising a white LED package and an optical component comprising the composite material of the afore-described composite material, wherein at least part of the yellow light generated by the white LED package may be filtered by the optical component.

Figure 2:
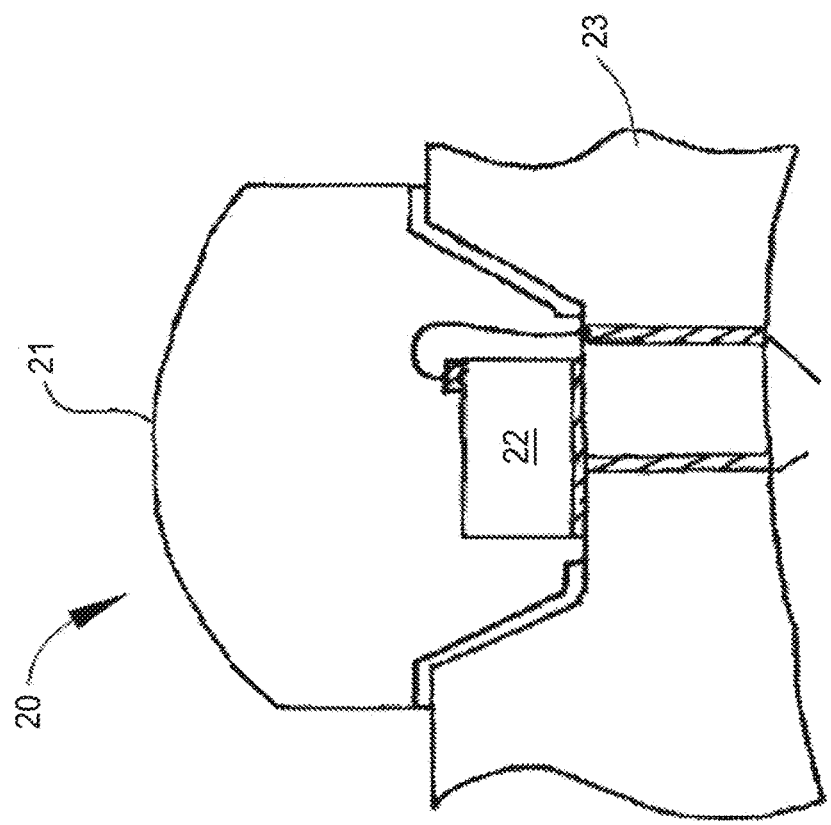
FIG. 2 illustrates a partially cross-sectional view of a lighting apparatus comprising an optical component in accordance with another embodiment of the present invention.

In some embodiments, the optical component comprising the composite material may be a lamp cover or enclosure. As an example, FIG. 1 illustrates a lighting apparatus 10 comprising a cover or enclosure 11, an Edison type threaded base connector 12, a housing or base 13 between the cover or enclosure 11 and the connector 12, and, optionally, heat dissipating fins 14; wherein the cover or enclosure 11 is formed of the composite material. As another example, FIG. 2 illustrates a lighting apparatus 20 comprising a dome cover or enclosure 21 that serves as an optically envelope enclosing an LED chip 22 mounted on a printed circuit board (PCB) 23; wherein the dome cover or enclosure 21 is formed of the composite material. In some embodiments, the optical component comprising the composite material may be other components located inside or outside the lamp cover or enclosure.

In some embodiments, the white LED package comprises a phosphor and a blue light source with a peak wavelength ranging from 440 nm to 460 nm, especially about 450 nm, and in these embodiments, the weight percentage of the particles of neodymium compound in the composite material for forming the optical component is from 0.4% to 8%.

In some embodiments, the white LED package comprises a phosphor and a blue light source with a peak wavelength less than 435 nm, for example, the peak wavelength is less than 430 nm, ranges from 420 nm to 430 nm, or is about 425 nm. In these embodiments, the weight percentage of the particles of neodymium compound in the composite material may have no limiting, or may also be limited from 0.4% to 8%. Moreover, in these embodiments, as the peak wavelength is less than 430 nm, an extra UV-light usually added into the light apparatus for better visual effect is unnecessary, which is helpful for eye protection.

The following table 3 shows a chromaticity coordinate (CCX and CCY), CRI, R9 and net CSI of lights of lighting apparatuses comprising optical components formed of the composite material with different thickness, wherein, in each lighting apparatus, the polymeric matrix material is PC, the neodymium compound is $NdF_3$, the doping concentration (weight percentage) of $NdF_3$ is 4.5%, and the CRI of the white LED package is about 80, and the white LED package comprising a blue light source with a phosphor and a peak wavelength of about 450 nm.

TABLE 3

| thickness | CRI | R9 | net CSI | CCX | CCY |
|---|---|---|---|---|---|
| 0 mm | 81.1 | 13.7 | −2 | 0.4595 | 0.4113 |
| 1 mm | 86.5 | 30.7 | 2 | 0.4693 | 0.4053 |
| 2 mm | 89.1 | 39.1 | 9 | 0.4709 | 0.4014 |

According to the table 3, it can be seen that CRI, R9 and net CSI are better with the increase of the thickness of the optical component having a doping concentration of 4.5% of $NdF_3$ particles, and the light performance is well with the thickness of 2 mm.

The following table 4 shows a chromaticity coordinate (CCX and CCY), CRI, R9 and net CSI of lights of lighting apparatuses comprising optical components formed of the composite material with different thickness, wherein, in each lighting apparatus, the polymeric matrix material is polycarbonate, the neodymium compound is $NdF_3$, the doping concentration (weight percentage) of $NdF_3$ is 1%, and the CRI of the white LED package is about 80.

TABLE 4

| thickness | CRI | R9 | net CSI | CCX | CCY |
|---|---|---|---|---|---|
| 0 mm | 81.1 | 13.7 | −2 | 0.4595 | 0.4113 |
| 2 mm | 83 | 20 | 0 | 0.4644 | 0.4083 |
| 4.5 mm | 86.5 | 30.7 | 2 | 0.4693 | 0.4053 |
| 9 mm | 89.1 | 39.1 | 9 | 0.4791 | 0.3993 |
| 14 mm | 92 | 45 | 15 | 0.4899 | 0.3926 |

According to the table 4, it can be seen that, compared with an optical component does not comprises $NdF_3$ particles, the optical component comprising $NdF_3$ particles may improve the light performance by passing the light through the composite material.

Figure 3:
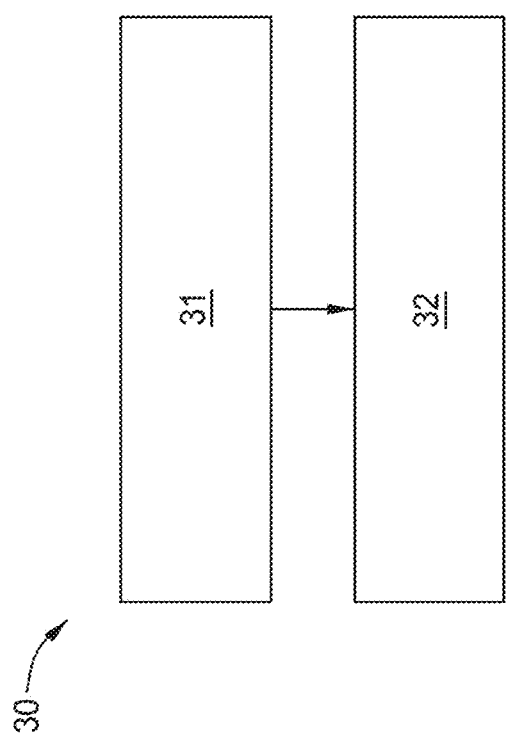
FIG. 3 illustrates a schematic flow diagram of a method for determining a doping concentration of particles of neodymium compound in a composite material in accordance with an embodiment of the present invention.

FIG. 3 illustrates schematic flow diagram of a method 30 for determining a doping concentration of particles of neodymium compound in the composite material. The method 30 comprises a step 31 and a step 32.

The step 31 comprises pre-determining a first mapping relationship of a colorimetric property of visible light passing through the composite material and the doping concentration of particles of neodymium compound in the composite material.

The colorimetric property indicates the color of the visible light passing through the composite material. The colorimetric property includes but is not limited to a chromaticity coordinate, CRI, R9 and CSI.

Figure 4:
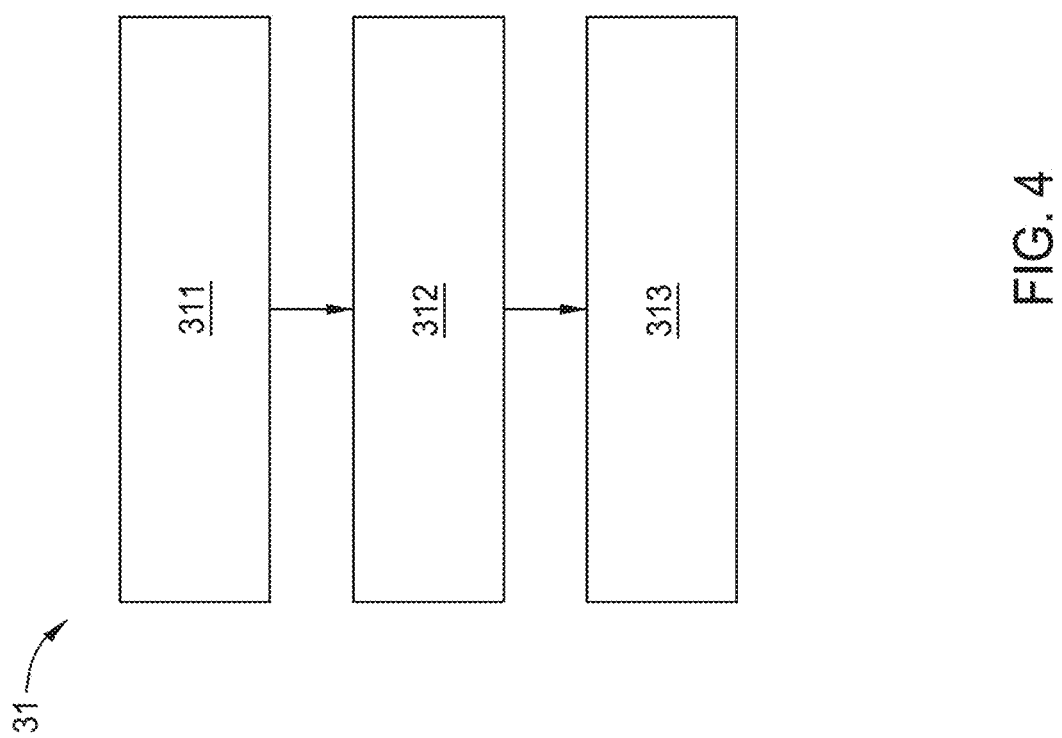
FIG. 4 illustrates a schematic flow diagram of a step 31 of FIG. 3 in accordance with an embodiment of the present invention.

In some embodiments, as shown in FIG. 4, the step 31 comprises the following steps:

In the step 311, light generated by a white light source is passed through a first composite material to obtain a first colorimetric property.

In the step 312, light generated by the white light source is passed through a second composite material to obtain a second colorimetric property. The first composite material and the second composite material have the same thickness and have different doping concentrations of particles of neodymium compound.

In the step 313, the first mapping relationship is determined based on the first and second colorimetric property.

By passing light generated by the same white light source through the first composite material and the second composite material which are almost the same with each other except the doping concentration of particles of neodymium compound, the first mapping relationship of the colorimetric property of visible light passing through the composite material and the doping concentration of particles of neodymium compound in the composite material may be obtained.

In some embodiments, the first mapping relationship may be obtained by passing light generated by the white light source through more composite materials (e.g., more than two) that are almost the same with each other except the doping concentration of particles of neodymium compound.

The step 32 comprises determining the doping concentration of particles of neodymium compound in the composite material corresponding to a desired colorimetric property based on the first mapping relationship.

As the first mapping relationship is obtained, it is easy to determine a doping concentration of particles of neodymium compound according to the desired colorimetric property.

Figure 5:
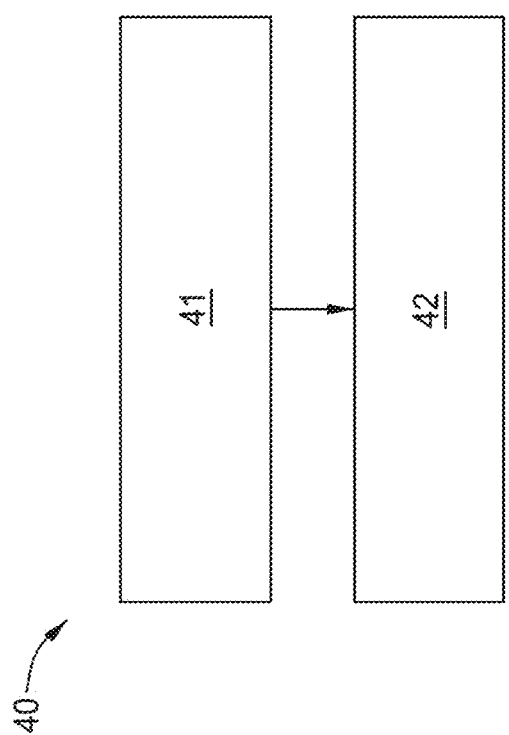
FIG. 5 illustrates a schematic flow diagram of a method for determining a thickness of a composite material in accordance with an embodiment of the present invention.

FIG. 5 illustrates a schematic flow diagram of a method 40 for determining a thickness of a composite material in accordance with an embodiment of the present invention. The method 40 comprises a step 41 and a step 42.

The step 41 comprises pre-determining a second mapping relationship of the colorimetric property of visible light passing through the composite material and the thickness of the composite material.

In some embodiments, the step 41 comprises the following steps:

In the step 411, light generated by a white light source is passed through a third composite material to obtain a third colorimetric property.

In the step 412, light generated by the white light source passed through a fourth composite material to obtain a fourth colorimetric property. The third composite material and the fourth composite material have different thicknesses and have the same doping concentration of particles of neodymium compound.

In the step 413, the second mapping relationship is determined based on the third and fourth colorimetric property.

By passing light generated by the same white light source through a third composite material and a fourth composite material which are almost the same with each other except the thickness, the second mapping relationship of the colorimetric property of visible light passing through the composite material and the thickness of the composite material may be obtained.

In some embodiments, the second mapping relationship may be obtained by passing light generated by the white light source through more composite materials (e.g., more than two) that are almost the same with each other except the thickness.

The step 42 comprises determining the thickness of the composite material corresponding to the desired colorimetric property based on the second mapping relationship.

As the second mapping relationship is obtained, it is easy to determine a thickness of the composite material according to the desired colorimetric property.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A composite material for light filtering, comprising: a polymeric matrix material and particles of neodymium compound doped in the polymeric matrix material, wherein a weight percentage of the particles of neodymium compound in the composite material is from 0.4% to 8%.

2. The composite material of claim 1, wherein the weight percentage of the particles of neodymium compound in the composite material is from 2% to 8%.

3. The composite material of claim 2, wherein the weight percentage of the particles of neodymium compound in the composite material is from 4% to 6%.

4. The composite material of claim 1, further comprising: particles of additive doped in the polymeric matrix material for light diffusion.

5. The composite material of claim 4, wherein the particles of additive doped in the polymeric matrix material comprise rutile titania $TiO_2$, $Al_2O_3$, or neodymium-containing metal oxides.

6. The composite material of claim 4, wherein the particles of additive doped in the polymeric matrix material comprise Nd-containing perovskite structure materials.

7. The composite material of claim 1, wherein the difference of refractive indices of the polymeric matrix material and the particles of neodymium compound is less than 0.1 in the visible light region.

8. The composite material of claim 7, wherein the source for the $Nd^{3+}$ ions are materials comprising an Nd—F compound.

9. The composite material of claim 8, wherein the Nd—F compound comprises neodymium fluoride, neodymium oxyfluoride, neodymium fluoride comprising adventitious water and/or oxygen, a neodymium hydroxide fluoride, or other compounds containing Nd—F.

10. The composite material of claim 9, wherein the neodymium oxyfluoride has a formula $NdO_xF_y$ where $2x+y=3$.

11. The composite material of claim 9, wherein the neodymium hydroxide fluoride has a formula $Nd(OH)_aF_b$ where $a+b=3$.

12. The composite material of claim 9, wherein the other compounds containing Nd—F has a formula Nd—X—F where X is at least one element that forms a compound with neodymium, the at least one element selected from oxygen, nitrogen, sulfur, and chlorine or at least one metallic element, other than Nd, that forms a compound with fluorine.

13. The composite material of claim 12, wherein the metallic element comprises Na, K, Al, Mg, Li, Ca, Sr, Ba, and Y, or combinations of such elements.

14. The composite material of claim 12, wherein the X of the Nd—X—F compound is Mg and Ca or Mg, Ca and O.

15. The composite material of claim 1, wherein the polymeric matrix material comprises polycarbonate, polystyrene, polyacrylate, silicone, or any combination thereof.

16. The composite material of claim 1, wherein the particles of neodymium compound doped in the polymeric matrix material comprise $Nd^{3+}$ ions.

17. The composite material of claim 1, wherein the polymeric matrix material comprises silicone and the particles of neodymium compound doped in the polymeric matrix material comprise $NdF_3$.

18. The composite material of claim 1, wherein the polymeric matrix material comprises polycarbonate and the particles of neodymium compound doped in the polymeric matrix material comprise NdFO.

19. The composite material of claim 1, wherein the polymeric matrix material comprises polycarbonate and the particles of neodymium compound doped in the polymeric matrix material comprise $NdF_3$.

20. The composite material of claim 1, wherein the composite materials have different doping concentrations of the particles of neodymium compound.

* * * * *